United States Patent [19]

Bayer et al.

[11] 4,138,729

[45] Feb. 6, 1979

[54] APPARATUS FOR DETERMINING DEFINING QUANTITIES OF A PLANAR VECTOR

[75] Inventors: Karl-Heinz Bayer; Felix Blaschke; Ingemar Neuffer; Wolfgang Michel, all of Erlangen, Fed. Rep. of Germany

[73] Assignee: Siemens Aktiengesellschaft, Munich, Fed. Rep. of Germany

[21] Appl. No.: 823,502

[22] Filed: Aug. 10, 1977

[30] Foreign Application Priority Data

Aug. 18, 1976 [DE] Fed. Rep. of Germany ....... 2637175

[51] Int. Cl.[2] ......................... G06J 1/00; H03K 13/02

[52] U.S. Cl. .............................. 364/603; 340/347 SY

[58] Field of Search ............... 364/602, 603, 604, 729, 364/730, 815, 817; 340/347 SY

[56] References Cited

U.S. PATENT DOCUMENTS

| | | | |
|---|---|---|---|
| 3,376,570 | 4/1968 | Lawson | 364/603 X |
| 3,558,863 | 1/1971 | Williams, Jr. et al. | 364/603 |
| 3,868,680 | 2/1975 | Rhodes | 364/603 X |
| 3,896,299 | 7/1975 | Rhodes | 364/603 |

*Primary Examiner*—Joseph F. Ruggiero
*Attorney, Agent, or Firm*—Kenyon & Kenyon, Reilly, Carr & Chapin

[57] ABSTRACT

A vector analyzer which serves for determining defining quantities of a planar vector in which the output of a digital counter is fed, via sine and cosine function generators, to a vector rotator addressed by the component voltages of an input vector and made to follow the value of the phase angle of the input vector by means of a three point control in order to make the output of the digital overflow counter follow the phase angle of an input vector by means of a control loop; the counter content is reset to zero without problem if the value 360° of the phase angle is exceeded. The invention can be used particularly for field orientation control of rotating field machines.

13 Claims, 3 Drawing Figures

APPARATUS FOR DETERMINING DEFINING QUANTITIES OF A PLANAR VECTOR

BACKGROUND OF THE INVENTION

The present invention relates to apparatus for determining the defining quantities of a planar vector (vector analyzer), using a sine and cosine function generator addressed on the input side by the output signal of an integrator in general and more particularly to an improved apparatus of this type.

Such apparatus, which, determines the magnitude and the phase angle of a vector from two input voltages proportional to orthogonal components of the vector, is described in U.S. Pat. No. 3,710,088. With this apparatus, however, phase angles only of such vectors which do not rotate, i.e., which always move within an angular range of 360°, can be determined. Furthermore, in the known apparatus, a large number of analog multipliers, which work inaccurately particularly in the range about zero are used.

SUMMARY OF THE INVENTION

It is an object of the present invention to provide apparatus of the type mentioned at the outset which is distinguished by higher accuracy and, above all, permits the phase angle of the vector which is to be analyzed, to be measured even if the phase angle changes by more than 360°.

According to the present invention, this problem is solved by using a digital bidirectional overflow counter as the integrator, the counting inputs of which can be enabled, to receive pulses of a clock generator, by the output signals of a three point switching member, the response thresholds of which are brought into proportional dependence on a first output voltage of a vector rotator. The input of the switching member is connected to a second output voltage of the vector rotator, which has as inputs the output signals of the function generators and two voltages proportional to orthogonal vector components.

Therefore the present invention makes the output of a digital overflow counter follow the phase angle of an input vector by means of a control loop, wherein the counter content is reset to zero without problem if the value of the phase angle exceeds 360°.

Through additional use of digital circuits, the accuracy of the determination can be increased. The digital output signal of the overflow counter is therefore not processed by analog function generators and a vector rotator containing conventional analog multipliers, after a digital to analog conversion. Instead, according to a further embodiment of the present invention the vector rotator contains four digital to analog converters as multipliers. The digital inputs of the converters are the output signals of digital Read Only memories (ROMs) used as function generators. The vector component voltages are provided as reference voltages to these digital to analog converters.

Figure 1:
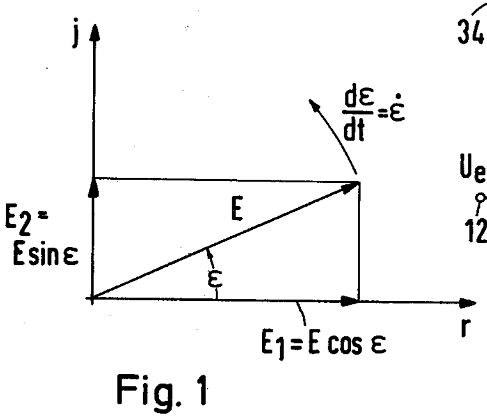
FIG. 1 shows a coordinate system wherein a planar vector is determined by two orthogonal vector components.

In the coordinate system of FIG. 1 with the axes r and j, a planar vector is determined by two orthogonal vector components $E_1 = E \cos \epsilon$ and $E_2 = E \text{ sine } \epsilon$. In many technical problems, a vector quantity is given in this manner, for instance, in representing a rotating field vector of rotating field machines. For purposes of field oriented control of the same, it is of importance to determine the magnitude E and the phase $\epsilon$ of this vector and to execute, particularly with this phase angle, arithmetic operations such as, for instance, additions. In this connection further the rate of change $d\epsilon/dt = \epsilon$ of the phase angle $\epsilon$ is also of interest.

Figure 2:
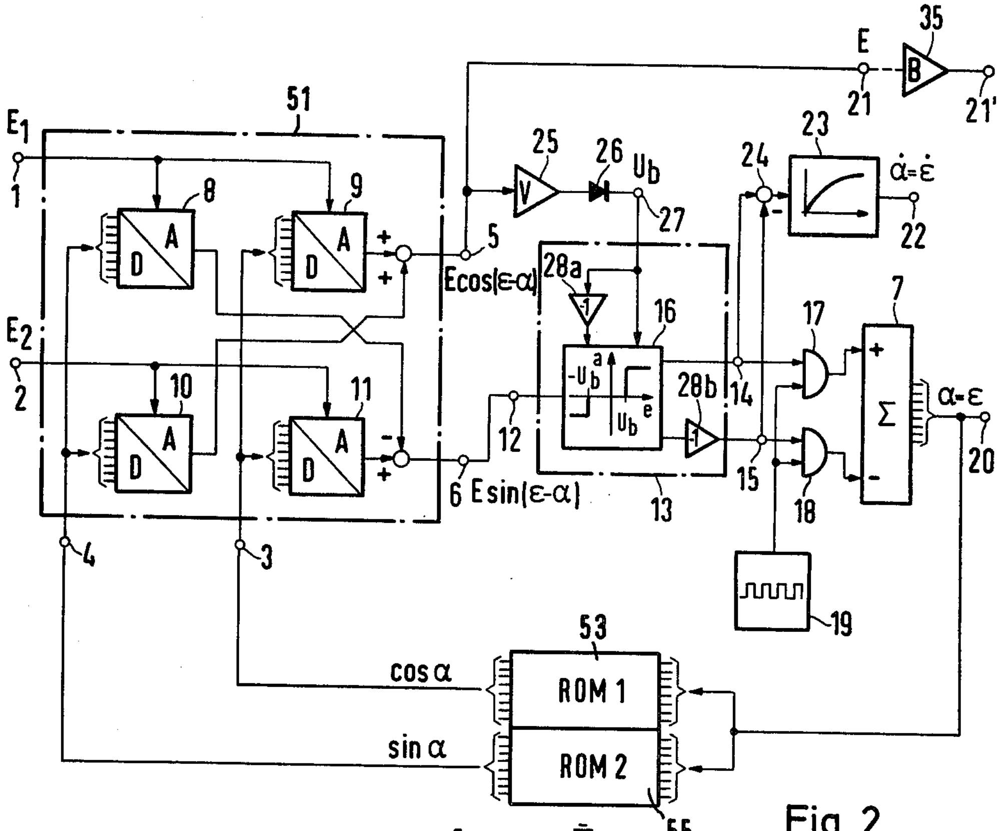
FIG. 2 is a block diagram of the vector analyzer apparatus of the present invention.

FIG. 2 shows a block diagram of the apparatus according to the present invention which allows determining the magnitude E, the phase angle $\epsilon$ and the rate of change of the phase angle $\epsilon$ of a planar vector given by two orthogonal vector components E1 and E2. Voltages $E_1$ and $E_2$ which are porportional to two orthogonal components of the vector to be analyzed are applied to the input terminals 1 and 2 of a vector rotator 51. The other two input terminals 3 and 4 of the vector rotator 51 are addressed by voltages which correspond to the sine and the cosine of an angle $\alpha$. These voltages describe a vector of magnitude 1 and the phase angle $\alpha$. The vector rotator 51, which can consist of four multipliers and two mixers in well known fashion, delivers at its output terminals 5 and 6 two voltages which are proportional to the magnitude E of the vector to be analyzed and the cosine and sine, respectively, of the phase angle difference $\epsilon - \alpha$. The phase angle $\alpha$ is represented in digital form by the counting stage outputs of a bidirectional overflow counter 7, which in the illustrated embodiment are connected to the respective inputs of two read only memories 53 and 55. In these read only memories, the cosine and sine functions are programmed permanently, so that with each digital value of the argument $\alpha$ present at the input of these memories, the corresponding sine and cosine value is associated, likewise in digital form. The outputs of the read only memories 53 and 55 are connected to the digital inputs of multiplying digital to analog converters 8 to 11 of the vector rotator 51, to the other, analog inputs of which the vector component voltages E1 and E2 are connected as reference voltages. In the digital to analog converters 8 to 11, a conversion of the digital input values into analog output voltages thus takes place, the latter then being additionally proportional to the reference voltage present at their respective analog inputs.

It would also be possible, of course, to convert the digital output of the counter 7 by means of a digital to analog converter and to feed it via an analog cosine and sine function generator each to the input terminals 3 and 4 of a conventional vector rotator, which would then be equipped with customary analog multipliers. With the embodiment shown, however, substantially higher accuracy and reproducibility is achieved, on the one hand, due to the digital reproduction of the sine and cosine values and, furthermore, the null errors inherent in analog multipliers are avoided.

The output voltage $E \text{ sine } (\epsilon - \alpha)$ appearing at the terminal 6 of the vector rotator 51 is fed to the input terminal 12 of the three point switching element 13, which delivers at its output 14 a positive signal if the input voltage present at the terminal 12 is greater than a threshold voltage $U_b$ and which delivers at its output 15 a positive signal if the input voltage at the terminal 12 is below a threshold voltage $-U_b$. Such a three point switching element can consist of two amplifiers connected as comparators, of which the one has a characteristic shown in the right hand part of the block symbol 16 and the other, the characteristic shown in the left hand part of this block symbol 16. The response thresholds $U_b$ and $-U_b$ are fixed by the biases applied to these amplifiers and are determined by the voltabe $U_b$ applied to the terminal 27 and by the output signal of the inverting amplifier 28*a* connected to it on the input side. A further inverting amplifier 28*b* is provided for adapting the output signal of the three point switching member.

If there is a phase angle difference $\epsilon - \alpha$, i.e., a deviation between the phase angle $\epsilon$ and the angle $\alpha$ at the output of the overflow counter 7, and if the latter is so large that the voltage present at the input terminal 12 of the three point switching member exceeds the response thresholds $U_b$ or $-U_b$, respectively, then one of the AND gates 17 or 18 is enabled to pass the pulses supplied by a clock generator 19, which then reach either the forward counting input, designated +, of the counter 7 or to its backward counting input, designated −. If, for instance, $\alpha$ is smaller than $\epsilon$, then a positive signal appears at the output terminal 14 and the pulses of the clock generator 19 increase the count of the counter 7 until $\alpha$ has become so large that the input voltage at the terminal 12 moves within the insensitivity range fixed by the response thresholds. If $\alpha$ is larger than $\epsilon$, then a positive signal will appear at the output terminal 15 and the count of the overflow counter 14 is accordingly decreased. The counter 7 has a maximum count corresponding to the angle $\alpha = 360°$. Thus the overflow counter is automatically reset when this value is exceeded and starts again to count upward from zero when addressed in the positive direction.

The three point switching member 13, in conjunction with the clock generator 19 and the two AND gates 17 and 18 can be considered as a regulator which comes to rest when balance is achieved, i.e., when the angle value $\alpha$ out of the counter 7 is matched to the value $\epsilon$ of the vector to be analyzed. If this balance is achieved, then $\alpha = \epsilon$ and a quantity corresponding to the magnitude E of the vector to be analyzed appears at the output terminal 21. It is advisable to choose the clock frequency of the clock generator 19 high enough that the counter 17 is able to follow any change in the phase angle $\epsilon$ very fast. At the terminal 22, which is connected to the output of a smoothing member 23, a voltage proportional to the rate of change $\alpha$ of the angle value $\alpha$ now appears. This follows from the fact that the counter 7 constitutes an integrator, the input variable or which is fed to the smoothing member 23 via a mixer with the correct sign.

The balancing now takes place with an accuracy which is determined by the spacing of the response thresholds. If the three point switching member 13 were provided with fixed response limits, this would result in accuracy decreasing with a decreasing amplitude E of the vector to be analyzed, for in this case only a larger deviation $\epsilon - \alpha$ could make the three point switching member respond. For this reason, the response limits are brought into proportional dependence on the amplitude E of the vector to be analyzed by connecting a linear amplifier 25 tied on the input side to the terminal 5 of the vector rotator 51, to the terminal 27 of the three point switching member 13 via a diode 26. The diode is to prevent the terminal 27 from being addressed by a negative voltage in the case when the angle deviation $\epsilon - \alpha$ becomes larger than 90°. The voltage present at the terminal 27, $U_b$, determines the response thresholds which are symmetrical to the zero level. In this manner, the response thresholds are changed proportionally to the amplitude E of the vector to be analyzed and the effect of the amplitude on the accuracy of the balance which could otherwise have been achieved only by using an analog multiplier with inherent errors is thus eliminated. The gain V of the linear amplifier 25 is advantageously chosen as small as possible; for stability reasons, it must comply with the relation $V > 0.5 \sin \Delta\alpha$, where $\Delta\alpha$ is the smallest possible change of the angle value $\alpha$ delivered by the counter 7.

Figure 3:
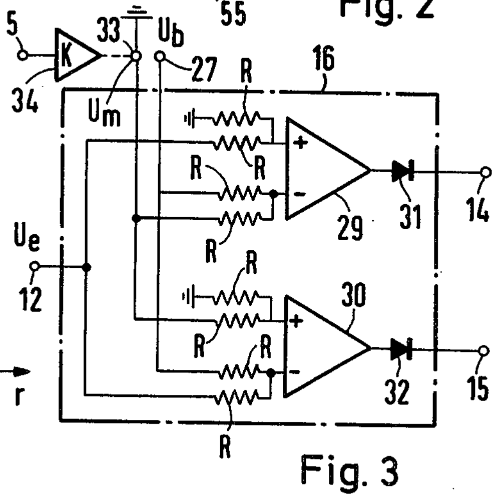
FIG. 3 is a detailed illustration of the three point switching member of FIG. 2.

FIG. 3 shows a particularly simple embodiment of the three point switching member 16 in the form of what is referred to as a window discriminator. The latter includes two amplifiers 29 and 30 with very high gain, the outputs of which are connected via diodes 31 and 32 to the output terminals 14 and 15. All input resistors R have the same resistance value. The voltage $U_e$ fed to the input terminal 12 is fed to the non-inverting input of the amplifier 29 and to the inverting input of the amplifier 30, while the voltage $U_b$ which determines the response limits, is coupled to the inverting inputs of the amplifiers 29 and 30. A voltage $U_m$ which can further be connected to the terminal 33 acts on the inverting input of the amplifier 29 and the non-inverting input of the amplifier 30. In this manner, the response thresholds are not given as absolutes but are always symmetrically to the voltage level determined by the voltage $U_m$, since the relation $U_e > U_m + U_b$ applies for the appearance of a positive output signal at the terminal 14 and the relation $U_e < U_m - U_b$ for the appearance of a positive output signal at the terminal 15. If the terminal 33 is connected not to zero potential but, as shown by the dashed line, to the output terminal 5 of the vector rotator 51 via an amplifier 34 with the gain K, then the response limits, i.e., the "insensitivity window", can be shifted and the value of the phase angle Δ then indicated by the overflow counter 7 is reduced by the constant value $\tan^{-1}K$. Thereby, the value of the indicated phase angle can be changed by a given amount in a simple manner. The magnitude E of the vector to be analyzed can be obtained for this case at the terminal 21' (FIG. 2), if the latter is connected, as likewise shown dashed to the terminal 21 via an amplifier 35 with the gain $\beta = \sqrt{1 + K^2}$.

What is claimed is:

1. In apparatus for determining the defining quantities of a planar vector using a sine and cosine function generator having as inputs the output signal of an integrator, the improvement comprising a. the integrator being a digital, bidirectional overflow counter;

b. a vector rotator having as inputs two voltages proportional to the orthogonal vector components of the vector to be defined and the outputs of the sine and cosine function generator and having first and second outputs;

c. a clock generator;

d. a three point switching member having said first output as an input to establish response thresholds in proportional dependence on said first output and said second output as a second input, to which it responds to provide output signals; and e. means enabled by said output signals, to couple the output of said clock generator to said counter.

2. The improvement according to claim 1, wherein the sine and cosine function generator comprises digital read only memories, said vector rotator comprises four multiplying digital to analog converters to the digital inputs of which the output signals of said digital read only memories are coupled with the vector component voltages provided as reference voltages to said digital to analog converters.

3. The improvement according to claim 2 wherein said three point switching member comprises a window discriminator and wherein said improvement further includes a linear amplifier having its output coupled to the input of said window discriminator for determining its window width, said linear amplifier having said first output voltage of said vector rotator as an input.

4. The improvement according to claim 3, and further including an additional linear amplifier having as an input the first output voltage of said vector rotator and having an output coupled to an input of said window discriminator determining the center of the window of the window discriminator.

5. The improvement according to claim 4, and further including a smoothing member having as inputs the output signals of said three point switching member.

6. The improvement according to claim 1 wherein said three point switching member comprises a window discriminator and wherein said improvement further includes a linear amplifier having its output coupled to the input of said window discriminator for determining its window width, said linear amplifier having said first output voltage of said vector rotator as an input.

7. The improvement according to claim 6 and further including an additional linear amplifier having as an input the first output voltage of said vector rotator and having an output coupled to an input of said window discriminator determining the center of the window of the window discriminator.

8. The improvement according to claim 7, and further including a smoothing member having as inputs the output signals of said three point switching member.

9. The improvement according to claim 1, and further including a smoothing member having as inputs the output signals of said three point switching member.

10. The improvement according to claim 2, and further including a smoothing member having as inputs the output signals of said three point switching member.

11. The improvement according to claim 1 wherein said means enabled by said output signals of said three point switching member comprises two AND gates.

12. The improvement according to claim 1 and further including a smoothing member having a mixer at its input, the mixer having as inputs the output signals of said three point switching member.

13. The improvement according to claim 1 wherein first output of said vector rotator is coupled to a terminal at which a signal proportional to the magnitude of said vector will appear and wherein said counter has an output terminal at which a signal proportional to the phase angle of said vector will appear.

* * * * *